(12) United States Patent
Buvid et al.

(10) Patent No.: US 9,935,035 B1
(45) Date of Patent: Apr. 3, 2018

(54) FLUID COOLED TRACE/VIA HYBRID STRUCTURE AND METHOD OF MANUFACTURE

(71) Applicant: INTERNATIONAL BUSINESS MACHINES CORPORATION, Armonk, NY (US)

(72) Inventors: Daniel J. Buvid, Rochester, MN (US); Eric J. Campbell, Rochester, MN (US); Sarah K. Czaplewski, Rochester, MN (US); Christopher W. Steffen, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/347,227

(22) Filed: Nov. 9, 2016

(51) Int. Cl.
*H01L 23/34* (2006.01)
*H01L 23/473* (2006.01)
*H01L 23/498* (2006.01)
*H01L 21/48* (2006.01)
*H01L 23/367* (2006.01)

(52) U.S. Cl.
CPC ........ *H01L 23/473* (2013.01); *H01L 21/4846* (2013.01); *H01L 21/4882* (2013.01); *H01L 23/3675* (2013.01); *H01L 23/49816* (2013.01); *H01L 23/49838* (2013.01); *H01L 23/49866* (2013.01)

(58) Field of Classification Search
CPC ................ H01L 21/4871; H01L 21/4882; H01L 23/473
See application file for complete search history.

(56) References Cited

U.S. PATENT DOCUMENTS

| | | | |
|---|---|---|---|
| 6,613,413 B1 | 9/2003 | Japp et al. | |
| 6,621,701 B2 | 9/2003 | Tamba et al. | |
| 6,944,946 B2 | 9/2005 | Japp et al. | |
| 8,059,400 B2 | 11/2011 | Lu et al. | |
| 9,298,231 B2 | 3/2016 | Arvelo et al. | |
| 2005/0068726 A1* | 3/2005 | Pleskach | H01L 23/3731 361/689 |
| 2006/0134831 A1* | 6/2006 | Cohen | G01R 3/00 438/108 |
| 2008/0266787 A1* | 10/2008 | Gosset | H01L 21/7682 361/689 |
| 2016/0037682 A1 | 2/2016 | Bernstein et al. | |
| 2016/0128232 A1 | 5/2016 | Chainer et al. | |

OTHER PUBLICATIONS

Ibm et al., "Method and Structures for Cooling a Multi-Layer Laminate With Dielectric-Embedded Channels" IP.com (Jun. 2008) pp. 1-12, IP.com No. IPCOM000171775D.

* cited by examiner

*Primary Examiner* — Marc Armand
*Assistant Examiner* — Sarah Salerno
(74) *Attorney, Agent, or Firm* — Tutunjian & Bitetto, P.C.; Robert R. Williams

(57) ABSTRACT

An interposer structure including a dielectric base material, and a metal based interconnect structure extending through the dielectric base material from a first side of the dielectric base material to an opposing second side of the dielectric base material. At least one metal line of the metal based interconnect structure extends from the first side of the dielectric base material to the second side of the dielectric base material and has a first non-linear portion. A fluidic passage extends through the dielectric base material, wherein the fluidic passage has a second non-linear portion.

14 Claims, 6 Drawing Sheets

FLUID COOLED TRACE/VIA HYBRID STRUCTURE AND METHOD OF MANUFACTURE

BACKGROUND

Technical Field

The present invention generally relates to interconnect structures, and more particularly to forming interconnect structures that also include fluid cooling passageways.

Description of the Related Art

Copper wires and interconnects typically seen in printed circuit board (PCBs), interposers and package substrates. An interposer is a form of interconnect that is placed between a printed circuit board (PCB) and a processor. As chips continue to scale, chips become denser requiring a higher pin count for the input/output (I/O). An interposer is used to spread a connection to a wider pitch or to re-route to a different connection. In conventional interconnect structures that extend through a substrate, the metal lines are limited to being straight. Silicon interposers with microfluidic cooling paths have been explored as a way to cool stacks of microprocessor chips. Microfluidic cooling paths formed into silicon interposers are typically limited by expensive and complicated photolithography techniques. Similar to metal lines, microfluidic cooling paths are typically limited to being straight in geometry.

SUMMARY

In one embodiment, a method of forming an interconnect in combination with fluidic cooling structures is described herein that includes providing a sacrificial interconnect trace structure and a sacrificial fluidic cooling structure using an additive forming method; and forming a continuous seed metal layer on the sacrificial trace structure and the sacrificial fluidic cooling structure. The sacrificial interconnect trace structure is removed, wherein the sacrificial fluidic cooling structure remains. An interconnect metal layer is formed on the continuous seed layer that was present on the sacrificial trace structure. A dielectric material is formed on the interconnect metal layer to encapsulate a majority of the interconnect metal layer, wherein ends of the interconnect metal layer are exposed through one surface of the dielectric material to provide the interconnect extending into the dielectric material. The sacrificial fluid cooling structure can then be removed selectively to the continuous seed metal layer to provide fluidic passages through the dielectric material.

In another embodiment, the method of forming the interconnect in combination with the fluidic cooling structures may include providing a sacrificial interconnect trace structure having at least one first non-linear portion and a sacrificial fluidic cooling structure having at least one second non-linear portion using an additive forming method. The method continuous with forming a continuous seed metal layer on the sacrificial trace structure and the sacrificial fluidic cooling structure. The sacrificial interconnect trace structure is removed, wherein the sacrificial fluidic cooling structure remains. An interconnect metal layer is formed on the continuous seed layer that was present on the sacrificial trace structure. The interconnect metal layer has the at least one second non-linear portion. A dielectric material is formed on the interconnect metal layer to encapsulate a majority of the interconnect metal layer, wherein ends of the interconnect metal layer are exposed through one surface of the dielectric material to provide the interconnect extending into the dielectric material. The sacrificial fluid cooling structure is removed selectively to the continuous seed metal layer to provide fluidic passages having the at least one second non-linear portion that extend through the dielectric material.

In another aspect, an interposer structure is provided. The interposer structure may include a dielectric base material, and a metal based interconnect structure extending through the dielectric base material from a first side of the dielectric base material to an opposing second side of the dielectric base material. At least one metal line of the metal based interconnect structure extends from the first side of the dielectric base material to the second side of the dielectric base material and has a first non-linear portion. A fluidic passage extends through the dielectric base material, wherein the fluidic passage has a second non-linear portion.

These and other features will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1A:
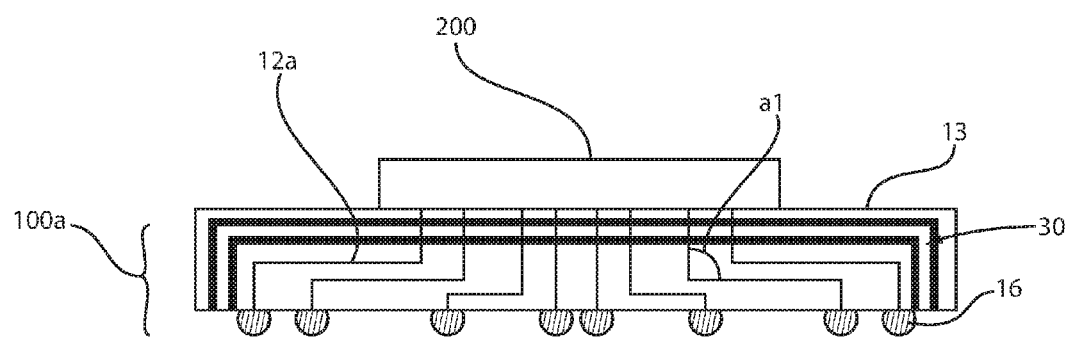
FIG. 1A is a side cross-sectional view depicting one embodiment of an interposer including metal based interconnect structures and fluidic cooling structures that each include angled portions.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Silicon interposers with microfluidic/cooling paths have been explored as an effective way to cool chip stacking solutions, e.g., 2.5 dimensional and 3 dimensions chip stacking solutions. Typically, forming microfluidic cooling paths require expensive photolithography techniques to build the fluidic passages into the interposer structure. These structures are typically limited by thickness, because the through interposer vias must by manufactured from traditional photolithography, etching, and plating techniques. Copper wires and interconnects typically seen in printed circuit boards, interposers and package substrates are typically limited to being manufactured in straight horizontal and vertical directions.

In some embodiments, the methods and structures disclosed herein provide interconnect structures having fluidic passages extending through the dielectric body of the interconnect structure. In some embodiments, the methods and structures disclosed herein provide for forming electrically conductive lines having curvatures, angled portions and orthogonal portions through dielectric structures. In some embodiments, the methods and structures disclosed herein manufacture a copper trace, via, pad hybrid structure, including orthogonal and curved pathways. This can allow for shorter interconnect, lower latency and lower impedance in the electrical devices employing the structures and methods described herein. The fluidic passages extending through the dielectric body of the interconnect structure may also include curvatures, angled portions and orthogonal portions through dielectric structures.

Figure 1B:
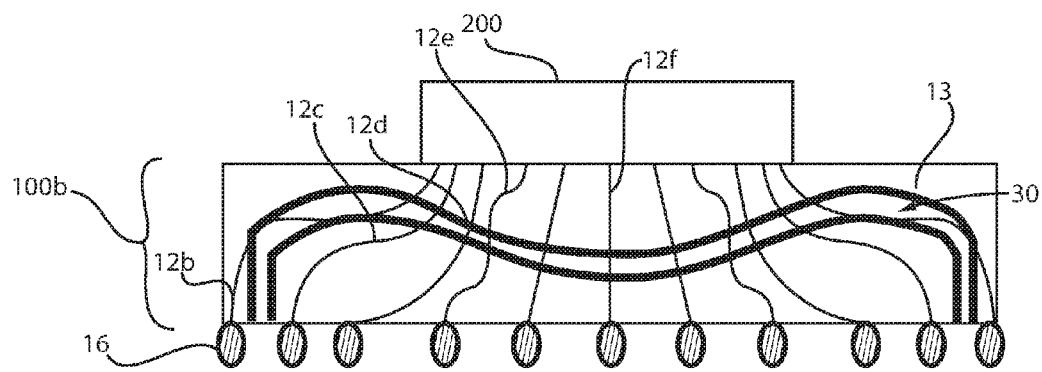
FIG. 1B is a side cross-sectional view depicting one embodiment of an interposer including metal based interconnect structures and fluidic cooling structures that each include curved portions.

FIGS. 1A and 1B illustrate some embodiments, of an interposer 100a, 100b which is one example of an interconnect structure within the scope of the present disclosure, that includes a metal based interconnect structure 20a, 20b, 20c, 20d, 20e, and a fluidic passage 30. In some embodiments, the interposer 100a, 100b includes a dielectric base material, i.e., dielectric body 13, and a metal based interconnect structure 20a, 20b, 20c, 20d, 20e extending through said dielectric base material from a first side of the dielectric base material to an opposing second side of the dielectric base material. At least one fluidic passage 30 may also extends through the dielectric base material 13 in which one first opening of the at least one fluidic passage 30 is an entry point for a cooling medium to be introduced to the dielectric base material 13, and at least one second opening of the at least one fluidic package 30 is an exit point for the cooling medium within the fluidic passage 30 to exit the dielectric base material. The entry and exit points for the fluid passage 30 may be on a same sidewall of the dielectric base material 13, or may be present on opposing sidewalls of the dielectric base material 13. The fluid passages 30 are suitable for water, water based coolants, alcohol based coolants, refrigerants, as well as other fluidic coolants typically employed to cool electronics. In other embodiments, the fluid passages 30 may be used to pass forced cool air through the dielectric material 13.

Still referring to FIGS. 1A and 1B, in some embodiments, solder connections 16, e.g., solder bumps, may be present on opposing sides of the dielectric body 13 on exposed surfaces of said metal based interconnect structure.

In some embodiments, the metal based interconnect structure 20a, 20b, 20c, 20d, 20e extends through the dielectric body 13 an provide for electric communication across the interposer 100a, 100b from a first side of the interposer 100a, 100b that may be in electric contact with a microprocessor 200 to a second side of the interposer 100a, 100b. The second side of the interposer 100a, 100b may be in contact with a supporting substrate (not shown), in which the supporting substrate may include its own interconnect structure that is to be positioned in electrical communication with the metal based interconnect structure 20a, 20b, 20c, 20d, 20e of the interposer 100a, 100b.

The metal based interconnect structure 20a, 20b, 20c, 20d, 20e may be composed of any electrically conductive metal. "Electrically conductive" as used through the present disclosure means a material typically having a room temperature conductivity of greater than $10^5$ (S/m). In some embodiments, the metal based interconnect structure 20a, 20b, 20c, 20d, 20e may be comprised of aluminum (Al), copper (Cu), tungsten (W), tantalum (Ta), platinum (Pt), gold (Au), tin (Sn), silver (Ag), and other elemental metals. In other embodiment, the metal based interconnect structure 20a, 20b, 20c, 20d, 20e may be comprised of metal nitrides, such as tantalum nitride (TaN), titanium nitride (TiN), tungsten nitride (WN), and combinations thereof.

The dielectric base material of the dielectric body 13 may be composed of $SiO_2$, $Si_3N_4$, $SiO_xN$, SiC, SiCO, SiCOH, SiCH compounds, carbon doped oxides, inorganic oxides, inorganic polymers, hybrid polymers, organic polymers, polyamides, polyimides, polyphenylene oxide, organo-inorganic materials, spin-on glasses, silsesquioxane-based materials, diamond-like carbon (DLC), amorphous hydrogenated carbon and combinations thereof.

As noted above, the metal based interconnect structure 20a, 20b, 20c, 20d, 20e includes non-linear portions. Referring to the interposer 100A that is depicted in FIG. 1A, the metal based interconnect structures 20a may include angled portions. For example, linear line portions of the metal based interconnect structure 20a intersect at orthogonal angles α1, as depicted in FIG. 1A. Orthogonal refers to right angles, i.e., angles of 90°. It is noted that this is only one example of the angle between intersecting linear portions of the metal based interconnect structures 20a. For example, in one embodiment, the angle α1 connecting intersecting liner portions of the metal based interconnect structures 20a may range from 15° to 85°. In other embodiments, the angle α1 connecting intersecting liner portions of the metal based interconnect structures 20a may range from 30° to 60°. In some examples, the angle α1 connecting intersecting liner portions of the metal based interconnect structures 20a may be equal to 15°, 20°, 25°, 30°, 35°, 45°, 55°, 60°, 65°, 70°, 75°, 80°, 85° and 90°.

The fluidic passage 30 depicted in FIG. 1A may also have a non-linear portion. For example, the fluidic passage 30 may include two linear portions that intersect at an orthogonal angle similar to the angled portions of the metal based interconnect identified by reference number 12a. The fluidic passage 30 may include two substantially linear portions intersecting at any angle that has been described above for the intersecting angle of the metal based interconnects 12a described with reference to FIG. 1A.

Referring to the interposer 100B that is depicted in FIG. 1B, the metal based interconnect structures 20a, 20b, 20c, 20d, 20e may include curved portions. A curve is a line that is not straight. In some embodiments, the curvature of the metal line of the metal based interconnect structure is a single arc extending continuously from a first side to a second side of the dielectric base material as identified by reference number 20d. In another embodiment, the curvature of the metal based interconnect structure has multiple arcs, as depicted by the structures having reference numbers 20b, 20c and 20e. For example, the curvature may be sigmoidal. In yet other embodiments, the curvature for the metal lines of the metal based interconnect structures may include a first arc at a first side of the dielectric body 13, and a second arc at a second side of the dielectric body 13A, wherein a linear portion of the metal based interconnect structure is present therebetween, as illustrated by the structure having reference number 20b. In another embodiment, the metal based interconnect structure may be "U" shaped, in which both ends of the interconnect exit the dielectric base material 13 on a same side.

The fluidic passage 30 depicted in FIG. 1B may also have a non-linear portion. For example, the fluidic passage 30 may include at least one curvature. In some examples, the fluidic passage 30 may include at least one curvature having a geometry similar to the curvatures that have been described for the metal interconnect structures 20b, 20c, 20d, 20e that are depicted in FIG. 1B. For example, the fluidic passage 30 may include a single arc extending continuously from a first side to a second side of the dielectric base material 13. In another embodiment, the fluidic passage 30 may include multiple arcs. In yet another embodiment, the fluidic passage 30 includes a first arc at a first side of the dielectric base material 13, and a second arc at a second side of the dielectric base material, wherein a linear portion of the passage is present therebetween. In another embodiment, the fluidic passage 30 may be "U" shaped, in which both ends of the passage exit the dielectric base material 13 on a same side.

It is noted that the angled structures that provide the metal based interconnect structures 20a in FIG. 1A, and the curved structures that provide the metal based interconnect structures 20b, 20c, 20d, 20e, may be employed simultaneously with linear metal lines in the same dielectric body 13. For example, FIG. 1B illustrates linear metal lines identified by reference number 20f.

Although the structure depicted in FIGS. 1A and 1B, is an interposer, the methods and structures disclosed herein are equally applicable to other forms of interconnect structures, as well as printed circuit boards (PCBs) and components related to printed circuit boards (PCBs).

It is further noted the metal interconnect structures 20a, 20b, 20c, 20d, 20 and the fluidic passages 30 are positioned along different planes within the dielectric body 13, and do not intersect. Further details of the methods of the present disclosure are now discussed with greater detail with reference to FIGS. 2-8B.

Figure 2A:
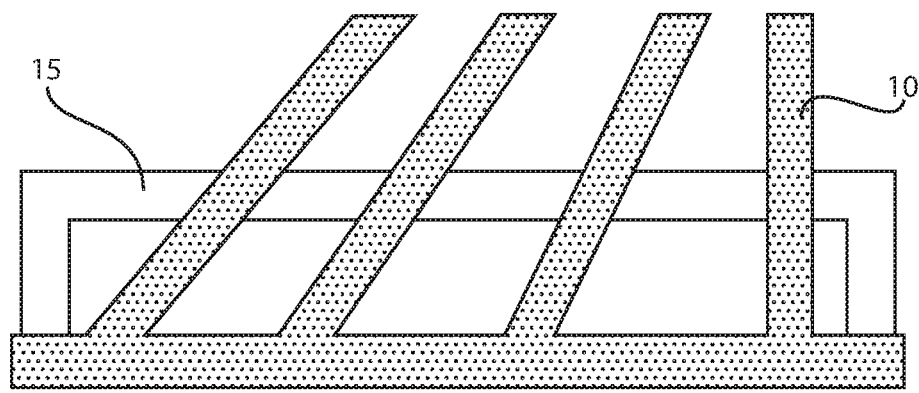
FIG. 2A is a side cross-sectional view of a sacrificial interconnect trace structure and a sacrificial fluidic cooling structure that has been formed using an additive forming method for one embodiment of a method for forming an interconnect in combination with fluidic cooling structures, in accordance with the present disclosure.
Figure 2B:
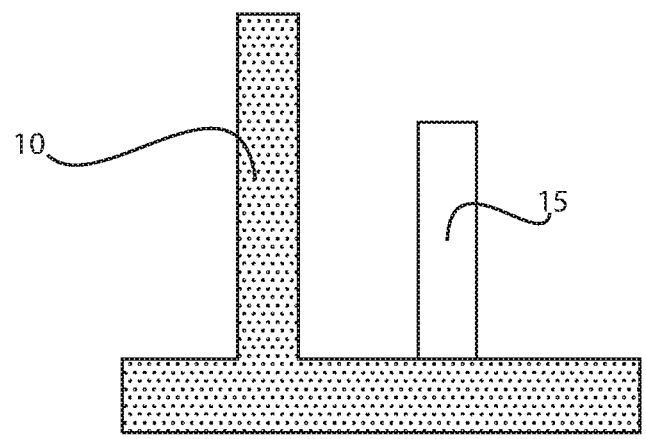
FIG. 2B is a side cross-sectional view of the structure depicted in FIG. 1A along section line B-B.

FIG. 2 depicts providing a sacrificial interconnect trace structure 10 and a sacrificial fluidic cooling structure 15 using an additive forming method. The term 'sacrificial" denotes a structure that facilitates the formation of a material layer within a final device structure, yet the sacrificial structure is not present in the final device structure. The sacrificial interconnect trace structure 10 provides a structure having a geometry, e.g., including lines having angles or curvatures, that provides the geometry of the later formed metal lines of the metal based interconnect structures, e.g., the structures identified by reference numbers 20a, 20b, 20c, 20d, 20e in FIGS. 1A and 1B. The sacrificial fluidic cooling structure 15 provides a structure having a geometry, e.g., including lines having angles or curvatures, that provides the geometry of the later formed fluidic passages 30, e.g., the structures identified by reference number 30 in FIGS. 1A and 1B.

Additive Manufacturing (AM) is an appropriate name to describe the technologies that build 3D objects by adding layer-upon-layer of material, whether the material is dielectric, plastic, metal, of semiconductor composition or combination thereof. The sacrificial trace structure 10 and the sacrificial fluidic cooling structure 15 is formed using a three dimensional additive method selected from the group consisting of stereolithography, self-propagating waveguide formation, fused deposition modeling (FDM), selective laser sintering (SLS), continuous liquid interface production (CLIP), digital light processing (DLP), material jetting, and combinations thereof.

Stereolithography a technique or process for creating three-dimensional objects, in which a computer-controlled moving laser beam is used to build up the required structure, layer by layer, from a liquid polymer that hardens on contact with laser light. In some embodiments, a stereolithography technique provides a method to build a 3D microstructure in a layer-by-layer process, which can involve a platform (e.g., substrate) that is lowered into a photo-monomer bath in discrete steps. At each layer, a laser is used to scan over the area of the photo-monomer that is to be cured (i.e., polymerized) for that particular layer. Once the layer is cured, the platform is lowered by a specific amount (i.e., determined by the processing parameters and desired feature/surface resolution), and the process is repeated until the complete 3D structure is created.

Fused deposition modeling (FDM) is an additive manufacturing technology, which works on an "additive" principle by laying down material in layers; a plastic filament or metal wire is unwound from a coil and supplies material to produce a part. In some embodiments, FDM builds parts up layer-by-layer by heating and extruding thermoplastic filament.

Self-propagating waveguide formation typically includes the use of a polymer foam, or other cellular material. Self-propagating waveguide may for ordered open cellular polymer materials with micro-lattice structures and features. These materials can be formed by exposing a two-dimensional mask with a pattern of circular apertures that is covering a reservoir containing a photomonomer. More specifically, collimated UV light can be used to expose liquid polymer through a mask to form polymer waveguide. Within the photomonomer, self-propagating photopolymer waveguides originate at each aperture in the direction of the UV collimated beam and polymerize together at points of intersection. By simultaneously forming an interconnected array of these fibers in three-dimensions and removing the uncured monomer, three dimensional lattice-based open-cellular polymer materials can be fabricated, In one embodiments, the sacrificial interconnect trace structure 10 and the sacrificial fluidic cooling structure 15 is comprised of a polymeric material. When the sacrificial interconnect trace structure 10 and the sacrificial fluidic cooling structure 15 is formed using stereolithography, the sacrificial interconnect trace structure 10 and the sacrificial fluidic cooling structure 15 can be composed of a photo-hardenable resin compositions comprises of at least one photo-polymerizable compound, such as a photo-polymerizable modified urethane (meth)acrylate compound, an oligoester acrylate compound, an epoxyacrylate compound, an epoxy compound, a polyimide compound, an aminoalkyd compound, and a vinyl ether compound, as a main component, and a photosensitive polymerization initiator. When the sacrificial trace structure 10 and the sacrificial fluidic cooling structure 15 is formed using FDM, the sacrificial trace structure 10 and the sacrificial fluidic cooling structure 15 can be composed of Acrylonitrile Butadiene Styrene (ABS), Polylactic acid (PLA), Polycarbonate (PC), Polyamide (PA), Polystyrene (PS), Polyether ether ketone (PEEK), lignin, rubber, and combinations thereof. When the sacrificial interconnect trace structure 10 and the sacrificial fluidic cooling structure 15 is formed using self-propagating waveguide formation, the sacrificial interconnect trace structure 10 and the sacrificial fluidic cooling structure 15 may be composed of thiol-ene polymer.

It is noted that the above compositions for the sacrificial interconnect trace structure 10 and the sacrificial fluidic cooling structure 15 and the additive manufacturing processes are provided for illustrative purposes and are not intended to limit the disclosed methods and structures to only the above examples. For example, in addition to the above examples, the sacrificial interconnect trace structure 10 and the sacrificial fluidic cooling structure 15 may also be formed using wire or textile layup, modular assembly, deformed perforated sheet lattice assembly, as well as other three dimensional additive methods.

Although the sacrificial trace structure 10 is depicted as having linear metal line portions, the sacrificial trace structure may include non-linear metal line portions, e.g., angled portions and curved portions, to provide metal interconnect structures similar to the non-linear metal lines of the metal interconnect structures 20a, 20b, 20c, 20d, 20e as depicted in FIGS. 1A and 1B. The sacrificial fluidic cooling structure 15 may have any of the geometries for the fluidic passages 30 described above with reference to FIGS. 1A and 1B.

Figure 3:
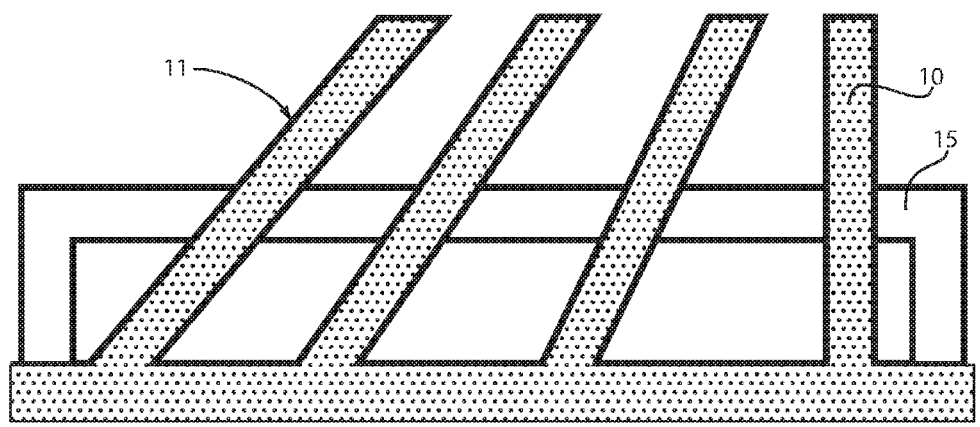
FIG. 3 is a side cross-sectional view depicting forming a continuous seed metal layer on the sacrificial trace structure and the sacrificial fluidic cooling structure depicted in FIG. 2A.

FIG. 3 depicts one embodiment of forming a continuous seed metal layer 11 on the sacrificial trace structure 10 and the sacrificial fluidic cooling structure 15. The continuous seed metal layer 11 may be composed of any metal, such as nickel, copper, aluminum, tungsten, titanium, platinum, gold, tin, silver, and combinations thereof. The thickness of the continuous seed metal layer 11 is selected to provide a seed layer for subsequent metal depositions, and have a thickness that is suitable to not be removed during the process step for removing the sacrificial trace structure 10 and the sacrificial fluidic cooling structure 15. The continuous seed metal layer 10 and the sacrificial fluidic cooling structure 15 is a deposited metal layer having a conformal thickness. The term "conformal" denotes a layer having a thickness that does not deviate from greater than or less than 30% of an average value for the thickness of the layer. By continuous it is meant that the continuous seed metal layer 10 is free of breaks.

The continuous seed metal layer 11 may be deposited using a physical vapor deposition (PVD) process. For example, the continuous seed metal layer 11 may be composed of nickel deposited using electroless plating. Electroless nickel plating (EN) is an auto-catalytic chemical technique used to deposit a layer of nickel-phosphorus or nickel-boron alloy. The process may employ a reducing agent, e.g., hydrated sodium hypophosphite ($NaPO_2H_2.H_2O$) which reacts with the metal ions to deposit metal. In other embodiments, the continuous seed metal layer 11 may be formed using electroplating and/or sputtering. In other embodiments, the continuous seed metal layer 11 may be formed using atomic layer deposition (ALD) or chemical vapor deposition (CVD), e.g., plasma enhanced chemical vapor deposition (PECVD). The thickness of the continuous seed metal layer 11 may have a thickness ranging from 5 nm to 100 µm. In another embodiment, the thickness of the continuous seed metal layer 11 may range from 1 µm to 100 µm. In another embodiment, the thickness of the continuous seed metal layer 11 may range from 10 nm to 50 nm. In some embodiments, the polymeric base material 9 may facilitate uniformity in the deposition of the continuous seed metal layer 11 on the portions of the sacrificial interconnect trace structure 10 that subsequently provide the metal lines of the metal interconnect structure of the interposer.

It is noted that in some embodiments, a block mask may be formed atop a portion of the sacrificial trace structure 10 prior to forming the continuous seed metal layer 11 to select which portions of the sacrificial interconnect trace structure 10 and the sacrificial fluidic cooling structure 15 that may be coated with the continuous seed metal layer 11.

Figure 4:
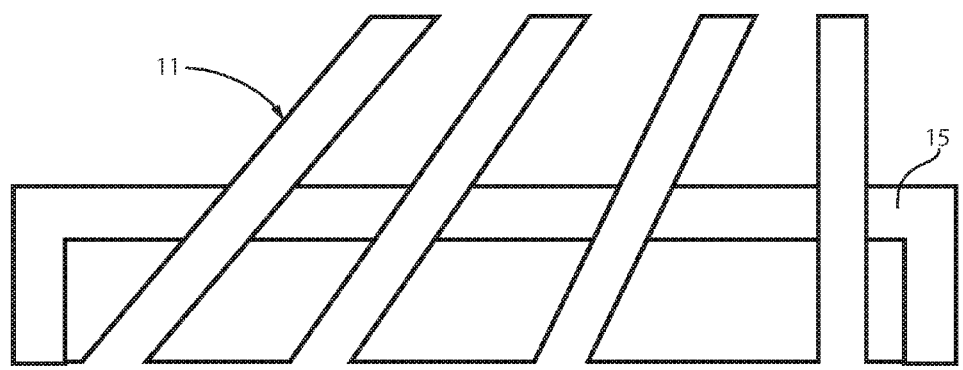
FIG. 4 is a side cross-sectional view depicting removing the sacrificial interconnect trace structure, wherein the sacrificial fluidic cooling structure remains, in accordance with one embodiment of the present disclosure.

FIG. 4 depicts one embodiment of removing the sacrificial interconnect trace structure 10, wherein the continuous seed metal layer 11 remains. Masking is utilized to ensure that the process steps for removing the sacrificial interconnect trace structure 10 do not also remove the sacrificial fluidic cooling structure 15. In some embodiments, masks for protecting the sacrificial fluidic cooling structure 15 may be formed from photoresist material using photolithography and developments processes.

In some embodiments, the sacrificial interconnect trace structure 10 may be removed by dissolving the polymeric material from which the sacrificial interconnect trace structure 10 was additively formed. In some embodiments, the sacrificial interconnect trace structure 10 may be removed by an etch process that is selective to the continuous seed metal layer 11. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The selective etch process may be a wet chemical etch or a dry etch.

Figure 5:
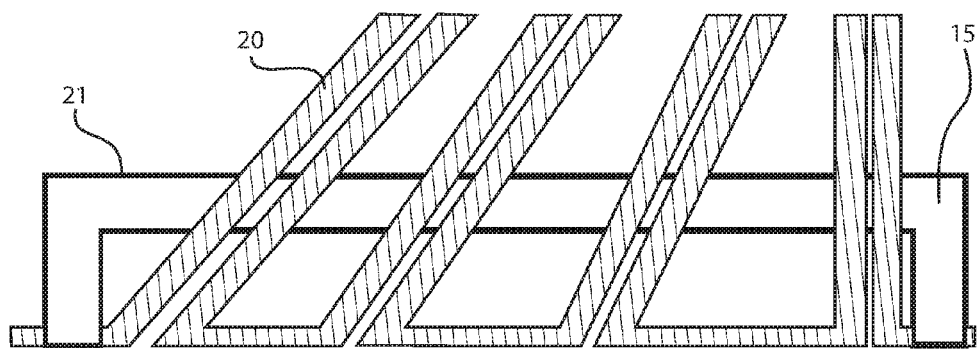
FIG. 5 is a side cross-sectional view depicting one embodiment of forming an interconnect metal layer is formed on the continuous seed layer that was present on the sacrificial trace structure.

FIG. 5 illustrates one embodiment of forming an interconnect metal layer 20 on the continuous seed metal layer 11. In one embodiment, the interconnect metal layer 20 may be deposited directly on the continuous seed metal layer 11 at a thickness that provides metal lines for the interconnect metal layer 20 that are hollow, as depicted in FIG. 5. In another embodiment, the interconnect metal layer 20 is deposited directly on the continuous metal seed layer 11 at a thickness to provide solid metal lines for the interconnect metal layer 20 of the interposer.

The interconnect metal layer 20 may be composed of any metal, such as the metal being deposited provides an electrically conducive material. For example, the interconnect metal layer 20 may be composed of copper, nickel, aluminum, titanium, tungsten, tantalum, platinum, gold, silver, tin and combinations thereof. In some embodiments, the interconnect metal layer 20 may be deposited using a physical vapor deposition (PVD) method, such as sputtering, evaporative deposition, and combinations thereof. In other embodiments, the interconnect metal layer 20 is formed using a plating method, such as electrolytic plating, electroless plating, and combinations thereof. In one embodiment, the interconnect metal layer 20 is formed composed of copper deposited using electroplating. One example of a plating bath composition that is suitable for electroplating the interconnect metal layer 12 of copper may include a copper sulfate ($CuSO_4$) solution with sulfuric acid ($H_2SO_4$). In some embodiments, electroless deposition of copper (Cu) may rely on the presence of a reducing agent, for example formaldehyde (HCHO), which reacts with the copper (Cu) metal ions to deposit the metal. In some other embodiments, the metal for the interconnect metal layer 20 may be deposited using a chemical vapor deposition (CVD) process, such as plasma enhanced chemical vapor deposition (PECVD) and metal organic chemical vapor deposition (MOCVD). In yet other embodiments, the metal for the interconnect metal layer 20 may be deposited using atomic layer deposition (ALD).

Still referring to FIG. 5, a metal coating layer 21 is also formed on the sacrificial fluidic cooling structure 15. The metal coating layer 21 may be formed using the process steps that provide the interconnect metal layer 20. Therefore, the metal coating layer 21 may have the same composition as the interconnect metal layer 20, and may be formed using the same forming process. For example, the metal coating layer 21 may have a conformal thickness that is directly formed on the outer surfaces of the sacrificial fluidic cooling structure 15.

Figure 6:
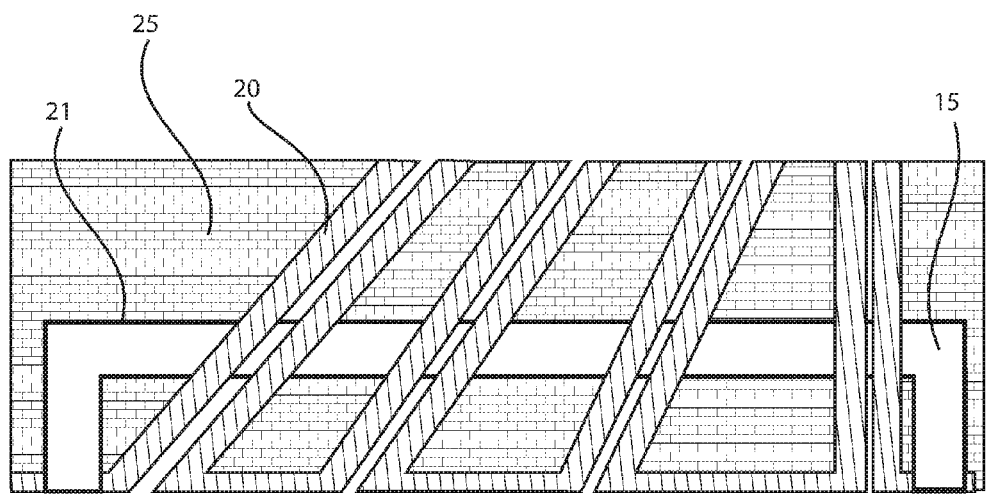
FIG. 6 is a side cross-sectional view depicting forming a dielectric material on the interconnect metal layer to encapsulate a majority of the interconnect metal layer, wherein ends of the interconnect metal layer are exposed through one surface of the dielectric material to provide the interconnect extending into the dielectric material, in accordance with one embodiment of the present disclosure.

FIG. 6 depicts one embodiment of a dielectric material 13 being formed on the interconnect metal layer 20 and the metal coating layer 21. The dielectric material 13 for encapsulating the interconnect metal layer 20 and the metal coating layer 21 that is present on the sacrificial fluidic cooling structure 15 can be composed of any dielectric or polymeric material that can be deposited in a manner that fills the voids between the adjacent interconnect metal layers 20 and metal coating layer 21/sacrificial cooling structure 15, in which the dielectric material 13 provides the dielectric body 13 of the interposer. In some embodiments, the dielectric material 13 may be an oxide, nitride or oxynitride material. In some examples, the dielectric material 13 may be selected from the group consisting of $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyimides, polyphenylene oxide, or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. The dielectric material 13 may be deposited using spin on deposition, chemical vapor deposition (CVD), injection molding, transfer molding, deposition from solution, dip coating, spray coating, and a vacuum may be employed to draw the dielectric material 13 within narrow passageways to ensure that the dielectric material 13 fully encapsulates the interconnect metal layers 20 and the and metal coating layer 21/sacrificial cooling structure 15.

FIG. 6 also depicts planarizing the opposing sidewalls of the dielectric material 13 to expose the ends of the interconnect metal layers 20 so that the interconnect metal lines extend through the dielectric body 13 and provide points for being engaged in electrical communication to the structures that are engaged to the interposer. The planarization process also exposes ends of the sacrificial cooping structure 15. The planarization process may be provided by grinding, polishing, chemical mechanical planarization (CMP) or a combination thereof.

Figure 7A:
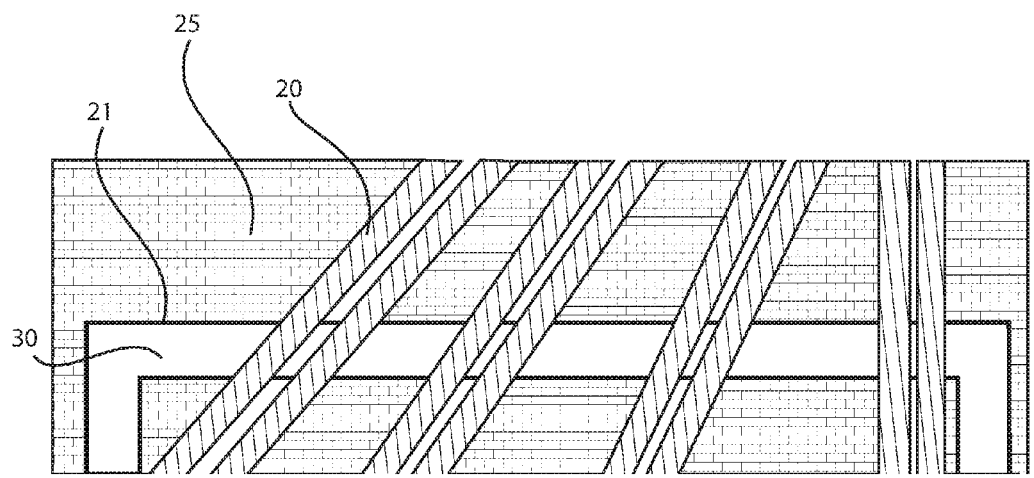
FIG. 7A is a side cross-sectional view depicting one embodiment of removing the sacrificial fluid cooling structure selectively to the continuous seed metal layer to provide fluidic passages through the dielectric material, in which the inlets to the fluidic passage are on one side of the body of the dielectric material.
Figure 7B:
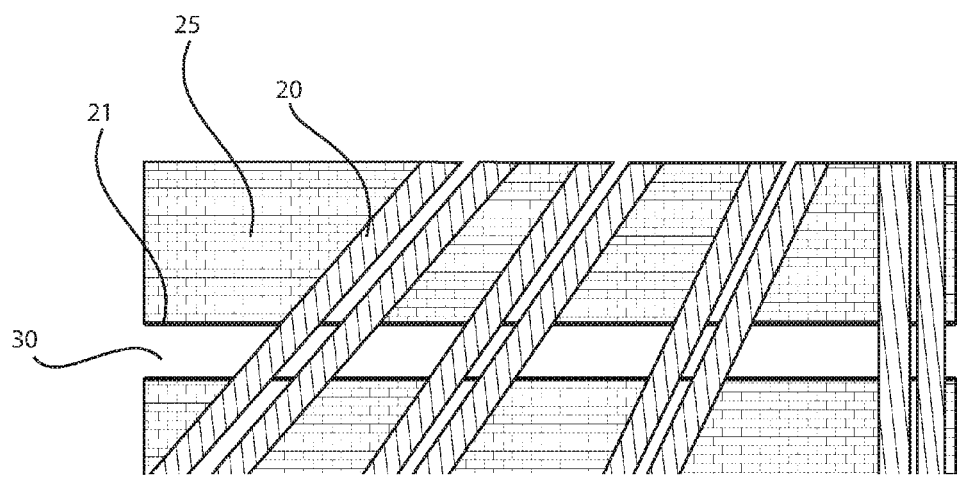
FIG. 7B is a side cross-sectional view depicting one embodiment of removing the sacrificial fluid cooling structure selectively to the continuous seed metal layer to provide fluidic passages through the dielectric material, in which the inlets to the fluidic passage are on opposing sides of the body of the dielectric material.

FIGS. 7A and 7B illustrate some embodiments of removing the sacrificial cooling structure 15 to provide the fluidic passage 30. FIG. 7A illustrates one embodiment of removing the sacrificial fluid cooling structure 15 selectively to the continuous seed metal layer 11 to provide fluidic passages 30 through the dielectric material 13, in which the inlets to the fluidic passage 30 are on one side of the body of the dielectric material 13. The sacrificial cooling structure 15 may be removed selectively to the portion of the continuous seed metal layer 11, so that the continuous seed metal layer 11 remains after the sacrificial cooling structure is removed. In some embodiments, the sacrificial cooling structure 15 may be removed by dissolving the polymeric material from which the sacrificial cooling structure 15 was additively formed. In some embodiments, the sacrificial cooling structure 15 may be removed by a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The selective etch process may be a wet chemical etch or a dry etch. Although, not depicted block masks may be employed to protect portions of the structure that need to be protected from the process sequencing that removes the sacrificial cooling structure 15.

FIG. 7B depicts one embodiment of removing the sacrificial fluid cooling structure 15 selectively to the continuous seed metal layer 11 to provide fluidic passages 30 through the dielectric material 13, in which the inlets to the fluidic passage 30 are on opposing sides of the body of the dielectric material 13. In some embodiments, the structure including the fluidic channel depicted in FIG. 7B can be formed from the structure depicted in FIG. 7A, by sectioning off the end portions of the interposer.

In some embodiments, solder bump processing may be applied to the structure depicted in FIGS. 7A and 7B. Solder bumps (also referred to as "solder balls"), such as C4 (controlled collapse chip connection) bumps, can be used to bond a chip to a chip carrier or to a chip to an interposer and then bond the interposer to the chip carrier. More specifically, solder bumps/solder balls 16, as depicted in FIG. 1, are formed on the exposed ends of the metal wires that provide the metal interconnect structure 20a, 20b, 20c, 20d, 20e, 20f. The term "solder", as used herein, refers to any metal or metallic compound or alloy that is melted and then allowed to cool in order to join two or more metallic surfaces together. Generally speaking, solders have melting temperatures in the range of 150° C. to 250° C. Solder bumps may be small spheres of solder (solder balls) that are bonded to contact areas, interconnect lines or pads of semiconductor devices. In some embodiments, the solder bumps can be made from lead-free solder mixtures or lead tin solder. The solder bumps 16 may be deposited using injection molding soldering (IMS) or sputtering.

Figure 8A:
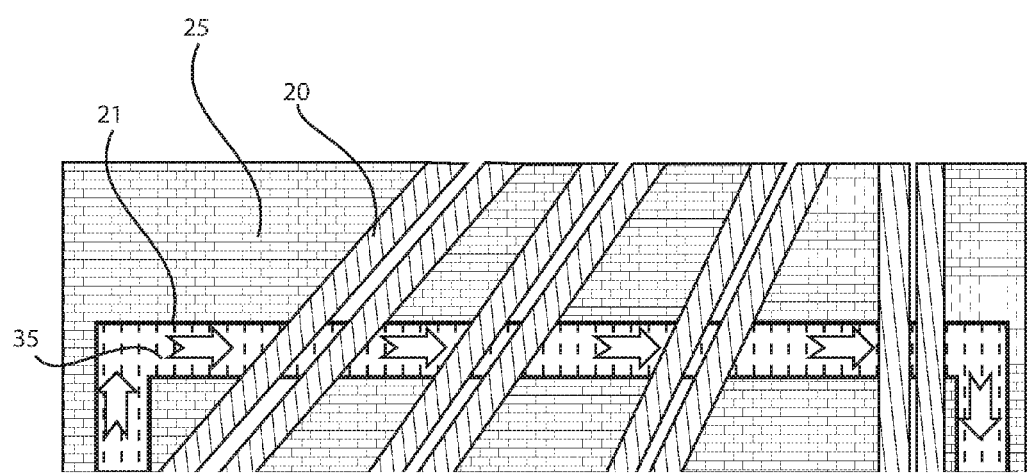
FIG. 8A is a side cross-sectional view depicting a cooling fluid passing through the fluidic passages of the structure depicted in FIG. 7A.
Figure 8B:
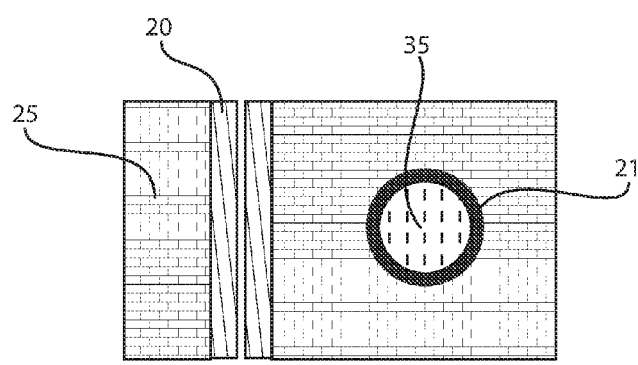
FIG. 8B is a top down planar view of the structure depicted in FIG. 8A.

FIGS. 8A and 8B depicting a cooling fluid 35 passing through the fluidic passages 30 of the structure 30 depicted in FIG. 7A. The cooling fluid 35 may be water or water based. In some embodiments, the cooling fluid 35 may be alcohol based. In other embodiments, the cooling fluid 35 may include refrigerants. In even further embodiments, air may be substituted for the cooling fluid 35, wherein forced air at cooling temperatures can be passed through the fluidic passages.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming an interconnect in combination with fluidic cooling structures comprising:
   providing a sacrificial interconnect trace structure and a sacrificial fluidic cooling structure using an additive forming method;
   forming a continuous seed metal layer on the sacrificial trace structure and the sacrificial fluidic cooling structure;
   removing the sacrificial interconnect trace structure, wherein the sacrificial fluidic cooling structure remains;
   forming an interconnect metal layer on the continuous seed layer that was present on the sacrificial trace structure;
   forming a dielectric material on the interconnect metal layer to encapsulate a majority of the interconnect metal layer, wherein ends of said interconnect metal layer are exposed through one surface of the dielectric material to provide said interconnect extending into said dielectric material; and
   removing the sacrificial fluid cooling structure selectively to the continuous seed metal layer to provide fluidic passages through said dielectric material.

2. The method of claim 1, wherein at least one of the sacrificial trace structure and the sacrificial fluidic cooling structure is comprised of a polymeric material.

3. The method of claim 1, wherein at least one of the sacrificial trace structure and the sacrificial fluidic cooling structure is formed using a three dimensional additive method selected from the group consisting of stereolithography, self-propagating waveguide formation, fused deposition modeling (FDM), selective laser sintering (SLS), continuous liquid interface production (CLIP), digital light processing (DLP), material jetting and combinations thereof.

4. The method of claim 3, wherein the continuous metal seed layer is composed of a metal selected from the group consisting of nickel, aluminum, tin, gold, copper, tantalum, titanium, platinum and combinations thereof.

5. The method of claim 4, wherein the continuous metal seed layer is deposited using electroless plating.

6. The method of claim 1, wherein removing the sacrificial trace structure comprises dissolving a polymeric material of the sacrificial trace structure.

7. The method of claim 1, wherein removing the sacrificial fluid cooling structure comprises dissolving a polymeric material of the sacrificial fluid cooling structure.

8. The method of claim 1, wherein the interconnect metal layer is composed of a metal selected from the group consisting of nickel, aluminum, copper, tantalum, titanium, platinum, tin, gold and combinations thereof.

9. The method of claim 8, wherein the interconnects composed of the interconnect metal layer and the continuous metal seed layer have a solid core.

10. The method of claim 8, wherein the interconnects composed of the interconnect metal layer and the continuous metal seed layer have a hollow core.

11. The method of claim 1, wherein said forming the dielectric material on the interconnect metal layer to encapsulate the majority of the interconnect metal layer comprises:

depositing the dielectric material using a deposition method selected from the group consisting of injection molding, transfer molding, chemical vapor deposition and combinations thereof; and planarization of the dielectric material to expose said ends of said interconnect metal layer.

12. A method of forming an interconnect in combination with fluidic cooling structures comprising:

providing a sacrificial interconnect trace structure having at least one first non-linear portion and a sacrificial fluidic cooling structure having at least one second non-linear portion using an additive forming method;

forming a continuous seed metal layer on the sacrificial trace structure and the sacrificial fluidic cooling structure;

removing the sacrificial interconnect trace structure, wherein the sacrificial fluidic cooling structure remains;

forming an interconnect metal layer on the continuous seed layer that was present on the sacrificial trace structure, the interconnect metal layer having said at least one second non-linear portion;

forming a dielectric material on the interconnect metal layer to encapsulate a majority of the interconnect metal layer, wherein ends of said interconnect metal layer are exposed through one surface of the dielectric material to provide said interconnect extending into said dielectric material; and removing the sacrificial fluid cooling structure selectively to the continuous seed metal layer to provide fluidic passages having said at least one second non-linear portion extending through said dielectric material.

13. The method of claim 12, wherein the sacrificial trace structure is formed using a three dimensional additive method selected from the group consisting of stereolithography, self-propagating waveguide formation, fused deposition modeling (FDM), selective laser sintering (SLS), continuous liquid interface production (CLIP), digital light processing (DLP), material jetting, and combinations thereof.

14. The method of claim 12, wherein the sacrificial fluidic cooling structure is formed using a three dimensional additive method selected from the group consisting of stereolithography, self-propagating waveguide formation, fused deposition modeling (FDM), selective laser sintering (SLS), continuous liquid interface production (CLIP), digital light processing (DLP), material jetting, and combinations thereof.

* * * * *